United States Patent
Wang et al.

(10) Patent No.: US 12,217,651 B2
(45) Date of Patent: Feb. 4, 2025

(54) DISPLAY SUBSTRATE AND MANUFACTURING METHOD THEREOF, AND DISPLAY APPARATUS

(71) Applicant: BOE Technology Group Co., Ltd., Beijing (CN)

(72) Inventors: Lizhong Wang, Beijing (CN); Ce Ning, Beijing (CN); Yunping Di, Beijing (CN); Binbin Tong, Beijing (CN); Chengfu Xu, Beijing (CN); Dapeng Xue, Beijing (CN); Shuilang Dong, Beijing (CN); Nianqi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/913,258

(22) PCT Filed: Nov. 4, 2021

(86) PCT No.: PCT/CN2021/128672
§ 371 (c)(1),
(2) Date: Sep. 21, 2022

(87) PCT Pub. No.: WO2022/247150
PCT Pub. Date: Dec. 1, 2022

(65) Prior Publication Data
US 2024/0212564 A1 Jun. 27, 2024

(30) Foreign Application Priority Data
May 24, 2021 (CN) .................. 202110564793.X (51) Int. Cl.
*G09G 3/20* (2006.01)
(52) U.S. Cl.
CPC ... *G09G 3/2092* (2013.01); *G09G 2300/0426* (2013.01); *G09G 2300/0842* (2013.01);
(Continued)

(58) Field of Classification Search
CPC .. G09G 3/3233; G09G 3/3648; G09G 3/3266; G09G 3/3225; G09G 3/3275;
(Continued)

(56) References Cited

U.S. PATENT DOCUMENTS

2007/0092661 A1* 4/2007 Ryuzaki ............... G02F 1/1362
257/E21.293
2018/0033804 A1 2/2018 Bae et al.
(Continued)

FOREIGN PATENT DOCUMENTS

CN 107248521 A 10/2017
CN 108598087 A 9/2018
(Continued)

OTHER PUBLICATIONS

Office Action dated Apr. 30, 2024, issued in counterpart CN Application No. 202110564793.X, with English translation. (16 pages).
(Continued)

*Primary Examiner* — Dong Hui Liang
(74) *Attorney, Agent, or Firm* — WHDA, LLP (57) ABSTRACT

A display substrate, a manufacturing method thereof and a display apparatus are provided. In the present disclosure, a first transistor group with oxide semiconductor as an active layer material is disposed on a side of a second transistor group with polysilicon as an active layer material away from the base, and an area enclosed by orthographic projections of the transistors in the first transistor group on the base is overlapped with an area enclosed by orthographic projections of the transistors in the second transistor group on the base. Stable performance of the transistors included can be ensured in a manufacturing process of the first transistor group and the second transistor group located in different layers, and at the same time, an area occupied by the driving
(Continued)

circuit can be reduced so as to decrease a frame width of a display apparatus or improve resolution of the display apparatus.

18 Claims, 4 Drawing Sheets

(52) U.S. Cl.
 CPC ............... *G09G 2310/0267* (2013.01); *G09G 2310/062* (2013.01); *G09G 2310/08* (2013.01)

(58) Field of Classification Search
 CPC ................... G09G 3/3258; G09G 3/32; G09G 2300/0426; G09G 2300/0842; G09G 2300/0819; G09G 2300/0861; G09G 2300/0452; G09G 2300/0809; G09G 2300/0408; G09G 2300/0465; G09G 2310/0286; G09G 2310/0297; G09G 2320/0233; G09G 2320/045
 See application file for complete search history.

(56) References Cited

U.S. PATENT DOCUMENTS

| | | | |
|---|---|---|---|
| 2019/0312061 A1 | 10/2019 | Son et al. | |
| 2019/0348479 A1 | 11/2019 | Huangfu et al. | |
| 2020/0152897 A1* | 5/2020 | Shishido | G09G 3/3233 |
| 2020/0202789 A1* | 6/2020 | Kobayashi | G09G 3/3426 |
| 2020/0286972 A1 | 9/2020 | Seo et al. | |
| 2021/0319725 A1 | 10/2021 | Zhu | |
| 2021/0358970 A1 | 11/2021 | Fang et al. | |
| 2021/0366422 A1* | 11/2021 | Kawashima | H01L 27/1225 |
| 2021/0408081 A1 | 12/2021 | Liu et al. | |
| 2021/0408082 A1* | 12/2021 | Xiao | H01L 27/127 |
| 2024/0069400 A1 | 2/2024 | Hanada et al. | |

FOREIGN PATENT DOCUMENTS

| | | |
|---|---|---|
| CN | 108845702 A | 11/2018 |
| CN | 110148600 A | 8/2019 |
| CN | 110581142 A | 12/2019 |
| CN | 111430428 A | 7/2020 |
| CN | 111489647 A | 8/2020 |
| CN | 111668263 A | 9/2020 |
| CN | 111710685 A | 9/2020 |
| CN | 112289815 A | 1/2021 |
| CN | 112420794 A | 2/2021 |
| CN | 112436020 A | 3/2021 |
| CN | 112510069 A | 3/2021 |
| CN | 215342598 U | 12/2021 |
| JP | 2000-012869 A | 1/2000 |
| WO | 2020184533 A1 | 9/2020 |

OTHER PUBLICATIONS

Office Action dated Aug. 15, 2024, issued in counterpart CN Application No. 202110564793.X, with English translation. (22 pages).
Extended (Supplementary) European Search Report dated May 17, 2024, issued in counterpart application No. 21942714.3. (6 pages).

* cited by examiner

DISPLAY SUBSTRATE AND MANUFACTURING METHOD THEREOF, AND DISPLAY APPARATUS

CROSS-REFERENCE TO RELATED APPLICATIONS

The present disclosure claims the priority of the Chinese patent application filed on May 24, 2021 before the China Patent Office with the application number of 202110564793.X and the title of "DISPLAY SUBSTRATE AND MANUFACTURING METHOD THEREOF, AND DISPLAY APPARATUS", which are incorporated herein in its entirety by reference.

TECHNICAL FIELD

The disclosure relates to the technical field of displaying and, more particularly, to a display substrate, a manufacturing method thereof and a display apparatus.

BACKGROUND

With continuous development of display technologies, it has posed higher requirements for a frame width and resolution of a display apparatus, and the display apparatus also develops towards narrow frame and high resolution gradually.

However, in an existing display apparatus, a quantity of transistors in a driving circuit is large, resulting in a wide frame or low resolution of the display apparatus.

SUMMARY

Following technical solutions are provided in some embodiments of the present disclosure.

In a first aspect, a display substrate is provided, which includes a base and a plurality of driving circuits disposed on the base. Each of the plurality of the driving circuit includes a first transistor group and a second transistor group, and the first transistor group is located at a side of the second transistor group away from the base.

The first transistor group and the second transistor group each include at least one transistor, active layers of transistors in the first transistor group are made of oxide semiconductor, and active layers of transistors in the second transistor group are made of polysilicon.

An area enclosed by orthographic projections of the transistors in the first transistor group on the base is overlapped with an area enclosed by orthographic projections of the transistors in the second transistor group on the base.

Optionally, the area enclosed by the orthographic projections of the transistors in the first transistor group on the base is located within the area enclosed by the orthographic projections of the transistors in the second transistor group on the base.

Optionally, the first transistor group includes one first transistor and one second transistor, the second transistor group includes one third transistor, and the third transistor is any one of the transistors in the driving circuit except the first transistor and the second transistor.

The driving circuit further includes a storage capacitor, and a second electrode of the first transistor and a second electrode of the second transistor are connected to a first end of the storage capacitor.

Optionally, a grid electrode of the third transistor is also connected to the first end of the storage capacitor.

An orthographic projection of a grid electrode of the first transistor and/or a grid electrode of the second transistor on the base is located in an orthographic projection of the grid electrode of the third transistor on the base.

Optionally, the first transistor and the second transistor are arranged in a same layer, and the first transistor and the second transistor are separated from the third transistor by a first buffer layer.

Optionally, the second transistor is located on a side of the first transistor away from the third transistor.

A second buffer layer is disposed between the first transistor and the third transistor, and a third buffer layer is disposed between the first transistor and the second transistor.

Optionally, the first transistor is located on a side of the second transistor away from the third transistor.

A fourth buffer layer is disposed between the second transistor and the third transistor, and a fifth buffer layer is disposed between the second transistor and the first transistor.

Optionally, a flat layer is disposed between the first transistor group and the second transistor group, and the flat layer covers transistors in the second transistor group.

Optionally, the flat layer is made of organic siloxane, and a thickness of the flat layer is 0.5 μm to 2 μm.

Optionally, the driving circuit is a pixel driving circuit arranged in the active area of the display substrate and configured for driving a luminescent device to emit light.

The first transistor is a first reset transistor, the second transistor is a compensation transistor, and the third transistor is a driving transistor.

A grid electrode of the first reset transistor is connected to a first reset signal line, a first electrode of the first reset transistor is connected to an initialization signal line, and a second electrode of the first reset transistor is connected to the first end of the storage capacitor.

A grid electrode of the compensation transistor is connected to a first grid line, a first electrode of the compensation transistor is connected to a second electrode of the driving transistor, and a second electrode of the compensation transistor is connected to the first end of the storage capacitor.

A grid electrode of the driving transistor is connected to the first end of the storage capacitor.

Optionally, the second transistor group further includes a data writing transistor, a first luminescent control transistor, a second luminescent control transistor and a second reset transistor.

A grid electrode of the data writing transistor is connected to a second grid line, a first electrode of the data writing transistor is connected to a data line, and a second electrode of the data writing transistor is connected to a first electrode of the driving transistor.

A grid electrode of the first luminescent control transistor is connected to the luminescent control signal line, a first electrode of the first luminescent control transistor is connected to a first power signal line, and a second electrode of the first luminescent control transistor is connected to the first electrode of the driving transistor.

A grid electrode of the second luminescent control transistor is connected to the luminescent control signal line, a first electrode of the second luminescent control transistor is connected to the second electrode of the driving transistor, and a second electrode of the second luminescent control transistor is connected to the first electrode of the luminescent device.

A grid electrode of the second reset transistor is connected to the second grid line, a first electrode of the second reset transistor is connected to the initialization signal line, and a second electrode of the second reset transistor is connected to the first electrode of the luminescent device.

A second end of the storage capacitor is connected to the first power signal line.

Optionally, the driving transistor, the data writing transistor, the first luminescent control transistor, the second luminescent control transistor and the second reset transistor are all arranged in a same layer.

Optionally, the driving circuit is a GOA circuit disposed in a non-active area of the display substrate.

The first transistor is a third reset transistor, the second transistor is an input transistor, and the third transistor is an output transistor.

A grid electrode of the third reset transistor is connected to a second reset signal line, a first electrode of the third reset transistor is connected to a second power signal line, and a second electrode of the third reset transistor is connected to the first end of the storage capacitor.

A grid electrode and a first electrode of the input transistor are both connected to the input signal line, and a second electrode of the input transistor is connected to the first end of the storage capacitor.

A grid electrode of the output transistor is also connected to the first end of the storage capacitor, a first electrode of the output transistor is connected to a clock signal line, and a second electrode of the output transistor is connected to the output signal line.

The second end of the storage capacitor is also connected to the output signal line.

Optionally, the second transistor group further includes a fourth reset transistor.

A grid electrode of the fourth reset transistor is connected to the second reset signal line, a first electrode of the fourth reset transistor is connected to the second power signal line, and a second electrode of the fourth reset transistor is connected to the output signal line.

Optionally, the output transistor and the fourth reset transistor are arranged in a same layer.

In a second aspect, there is provided a method for manufacturing a display substrate, which includes following content.

A base is provided.

A second transistor group corresponding to a driving circuit is formed on the base.

A first transistor group is formed on a side of the second transistor group away from the base.

The first transistor group and the second transistor group each includes at least one transistor, active layers of transistors in the first transistor group are made of oxide semiconductor, and active layers of transistors in the second transistor group are made of polysilicon.

An area enclosed by orthographic projections of the transistors in the first transistor group on the base is overlapped with an area enclosed by orthographic projections of the transistors in the second transistor group on the base.

Optionally, after the step of forming the second transistor group corresponding to each driving circuit on the base, the method further comprises:

forming a flat layer covering the transistors in the second transistor group.

In a third aspect, there is provided a display apparatus including the display substrate described above.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to explain the embodiments of the present disclosure or the technical scheme in the related art more clearly, the drawings required in the description of the embodiments or the prior art will be briefly introduced below: obviously, the drawings in the following description are some embodiments of the present disclosure, and other drawings can be obtained according to these drawings by those of ordinary skill in the art without paying creative labor.

DETAILED DESCRIPTION OF THE EMBODIMENTS

In order to make above objects, features and advantages of this disclosure more obvious and understandable, the disclosure will be further explained in detail below with reference to the drawings and detailed description.

Figure 1:
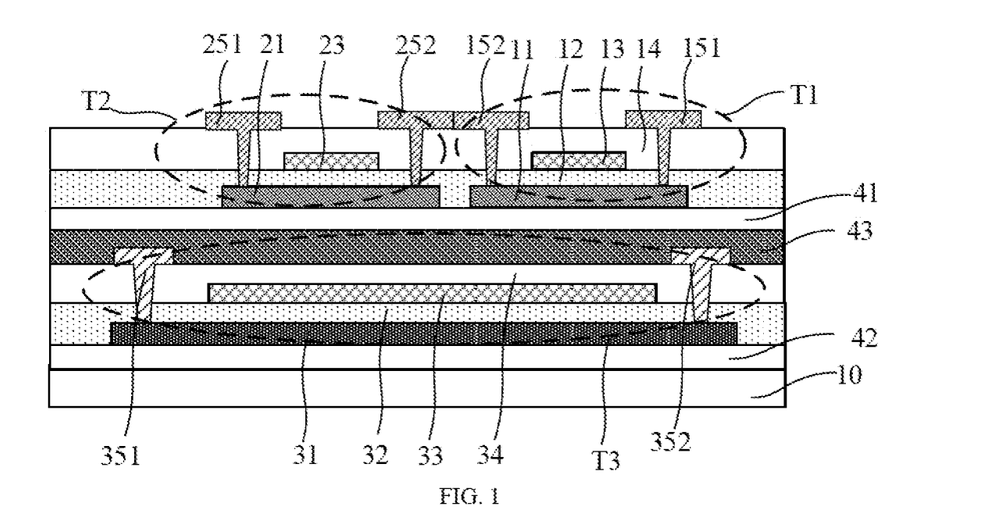
FIG. 1 shows a structural schematic diagram of a display substrate according to an embodiment of the present disclosure.
Figure 2:
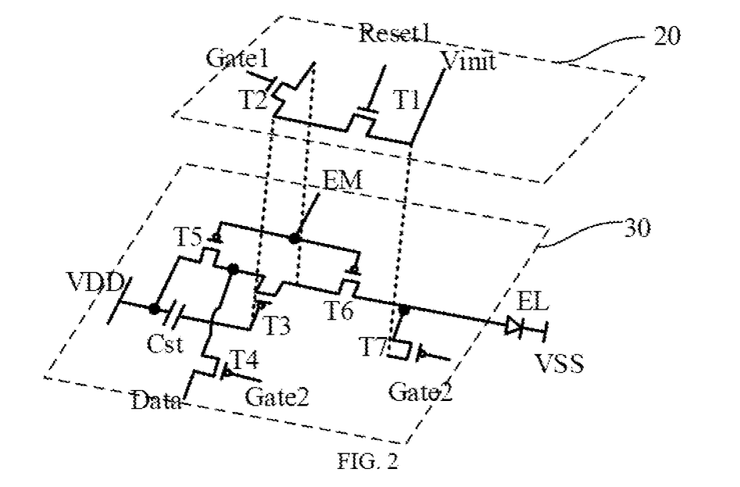
FIG. 2 shows a schematic diagram of a driving circuit which is a pixel driving circuit according to an embodiment of the present disclosure.
Figure 3:
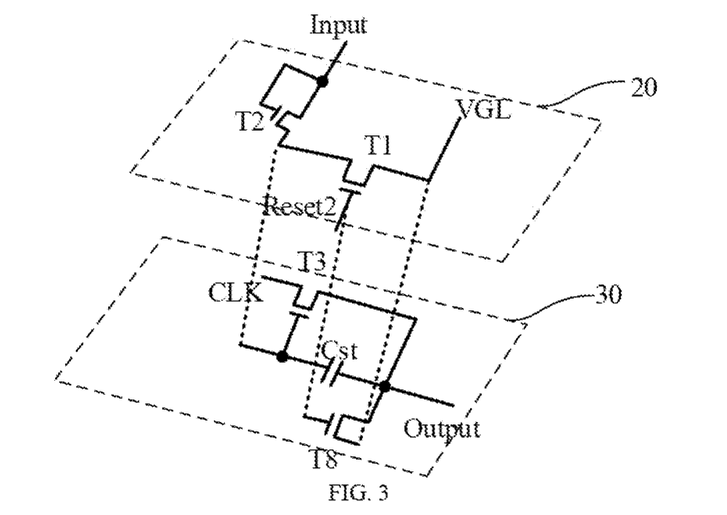
FIG. 3 shows a schematic diagram of a driving circuit which is a GOA circuit according to an embodiment of the present disclosure.

Referring to FIG. 1, FIG. 1 shows a structural schematic diagram of a display substrate according to an embodiment of the present disclosure. FIG. 2 shows a schematic diagram of a driving circuit which is a pixel driving circuit according to an embodiment of the present disclosure. FIG. 3 shows a schematic diagram of a driving circuit which is a GOA circuit according to an embodiment of the present disclosure.

A display substrate is provided in an embodiment of the disclosure, which includes a base 10 and a plurality of driving circuits disposed on the base 10. Each driving circuit includes a first transistor group 20 and a second transistor group 30, and the first transistor group 20 is located at a side of the second transistor group 30 away from the base 10. The first transistor group 20 and the second transistor group 30 each includes at least one transistor, active layers of transistors in the first transistor group 20 are made of oxide semiconductor, and active layers of transistors in the second transistor group 30 are made of polysilicon. An area enclosed by orthographic projections of the transistors in the first transistor group 20 on the base 10 is overlapped with an area enclosed by orthographic projections of the transistors in the second transistor group 30 on the base 10.

In actual products, the base 10 may be a rigid base, such as a glass base, or the base 10 may be a flexible base, such as a Polyimide (PI) base.

A plurality of driving circuits are disposed on a side of the base 10. The driving circuit may be a pixel driving circuit located in an active area of the display substrate and is configured to drive the luminescent devices to emit light. Therefore, each of sub-pixel areas in the active area is provided with a pixel driving circuit, and a luminescent device connected to the pixel driving circuit is controlled to emit light through the pixel driving circuit, thus realizing display of a picture. For example, in an Organic Light-Emitting Diode (OLED) display apparatus, the pixel driving circuit controls an OLED luminescent device to emit light. The driving circuit may also be a GateDriver on Array (GOA) circuit located in the non-active area of the display substrate, which is configured to provide a corresponding signal to a signal line in the active area. For example, in a Liquid Crystal Display (LCD) display apparatus, the GOA circuit is configured to provide a grid electrode signal to a row of grid lines arranged in the active area to control turn on and turn off of thin film transistors connected to the row of grid lines.

Regardless of whether the driving circuit is the pixel driving circuit arranged in the active area or the GOA circuit arranged in the non-active area, transistors in each of the driving circuits is classified into a first transistor group 20 and a second transistor group 30 according to a material of the active layer. Specifically, a transistor with oxide semiconductor as active layer material in the driving circuit is classified into the first transistor group 20, and a transistor with polysilicon as active layer material in the driving circuit is classified into the second transistor group 30.

The active layer material of transistors in the first transistor group 20 is the oxide semiconductor, which may be Indium Gallium Zinc Oxide (IGZO), in which an atomic molar ratio of indium, gallium and zinc is 1:1:1. Of course, the atomic molar ratio of indium, gallium and zinc in IGZO may be other values. Or, the oxide semiconductor may be other materials, such as Indium Tin Gallium Oxide (ITGO), etc.

Further, the first transistor group 20 is disposed on a side of the second transistor group 30 away from the base 10, that is, the second transistor group 30 is disposed on the base 10 firstly, and then the first transistor group 20 is disposed on the side of the second transistor group 30 away from the base 10. The transistors in the first transistor group 20 are not arranged in a same layer as the transistors in the second transistor group 30, but the transistors in the first transistor group 20 are arranged in layer configuration on the base 10. While the first transistor group 20) and the second transistor group 30 include at least one transistor.

In addition, the area enclosed by orthographic projections of transistors in the first transistor group 20 on the base 10 is overlapped with the area enclosed by orthographic projections of transistors in the second transistor group 30 on the base 10, so that an orthographic projection area of each driving circuit on the base 10 is reduced, that is, the area occupied by each driving circuit is reduced. If the driving circuit is the GOA circuit, when the area occupied by each driving circuit is reduced, a frame width occupied by a same number of driving circuits is reduced, that is, a frame width of the display apparatus is reduced. If the driving circuit is the pixel driving circuit, when the area occupied by each driving circuit is reduced, more pixel driving circuits may be disposed in a same area, that is, more sub-pixels are disposed in the same area, so that resolution of the display apparatus can be improved.

It should be noted that in the embodiment of the present disclosure, it is required that the first transistor group 20 with oxide semiconductor as the active layer material is disposed on the side of the second transistor group 30 with polysilicon as the active layer material away from the base 10, so as to ensure stable performance of the transistors in the driving circuit.

In manufacturing the active layers of the transistors in the second transistor group 30, it is necessary to deposit a layer of amorphous silicon film firstly, which is then patterned to obtain the patterned amorphous silicon layer. Then, the amorphous silicon layer is crystallized by a laser annealing process to convert the amorphous silicon layer into a polysilicon layer to obtain the active layer of the transistors in the second transistor group 30. If the second transistor group 30 is disposed on the side of the first transistor group 20 away from the base 10, active layers of transistors in the first transistor group 20 is made of oxide semiconductor, which has good thermal conductivity. Therefore, when the amorphous silicon layer in the second transistor group 30 is crystallized by the laser annealing process, heat may be conducted towards the active layer in the first transistor group 20, resulting in poor crystallinity of the amorphous silicon layer in the second transistor group 30, and thus resulting in the unstable performance of the transistors in the second transistor group 30. Furthermore, during the laser annealing process of the second transistor group 30, the laser may also have great influence on the performance of the transistors in the first transistor group 20, resulting in instability of the transistors in the first transistor group 20.

Therefore, in the embodiment of this disclosure, by arranging the first transistor group 20 on the side of the second transistor group 30 away from the base 10, the stable performance of transistors in the driving circuit can be ensured.

Optionally, the area enclosed by the orthographic projections of the transistors in the first transistor group 20 on the base 10 is located within the area enclosed by the orthographic projections of the transistors in the second transistor group 30 on the base 10.

At this time, the orthographic projection area of each driving circuit on the base 10, that is, orthographic projection areas of transistors in the second transistor group 30 on the base 10, may further reduce the area occupied by each driving circuit so as to further display a frame width of the display apparatus or further improve resolution of the display apparatus.

As shown in FIG. 1 to FIG. 3, the first transistor group 20 includes one first transistor T1 and one second transistor T2, the second transistor group 30 includes one third transistor T3, and the third transistor T3 is any one transistor except the first transistor T1 and the second transistor T2 in the driving circuit. The driving circuit further includes a storage capacitor Cst, and a second electrode 152 of the first transistor T1 and a second electrode 252 of the second transistor T2 are connected to a first end of the storage capacitor Cst.

Because a leakage current of a transistor with oxide semiconductor as active layer material is smaller than a leakage current of a transistor with polysilicon as active layer material, in the driving circuit, the oxide semiconductor is selected for the active layer of the first transistor T1 and the second transistor T2 connected to the storage capacitor Cst, which can prevent current leaking from the storage capacitor Cst to the first transistor T1 and the second transistor T2 accordingly. Thus, voltage stability of the storage capacitor Cst may be better, and a voltage of the storage capacitor Cst is more stable even at a low refresh rate, and thus a problem of picture flicker can be prevented at a low refresh rate, and required power consumption is also low.

In addition, a grid electrode 33 of the third transistor T3 is further connected to a first end of the storage capacitor Cst. An orthographic projection of a grid electrode 13 of the first transistor T1 and/or a grid electrode 23 of the second transistor T2 on the base 10 is located within an orthographic projection of the grid electrode 33 of the third transistor T3 on the base 10.

In actual products, the first end of the storage capacitor Cst is actually a first electrode plate of the storage capacitor Cst, the first electrode plate is a block-shaped electrode, and a shape of its orthographic projection on the base 10 is rectangular. The grid electrode 33 of the third transistor T3 actually refers to the first electrode plate of the storage capacitor Cst.

Because an area of the grid electrode 33 of the third transistor T3 is large, if the orthographic projection of the grid electrode 13 of the first transistor T1 on the base 10 is disposed to be within the orthographic projection of the grid electrode 33 of the third transistor T3 on the base 10, a double-gate-like structure can be formed in the first transistor T1, thus improving stability of the first transistor T1. Accordingly, if the orthographic projection of the grid electrode 23 of the second transistor T2 on the base 10 is disposed within the orthographic projection of the grid electrode 33 of the third transistor T3 on the base 10, a double-gate-like structure can be formed in the second transistor T2, thus improving stability of the second transistor T2.

Figure 4:
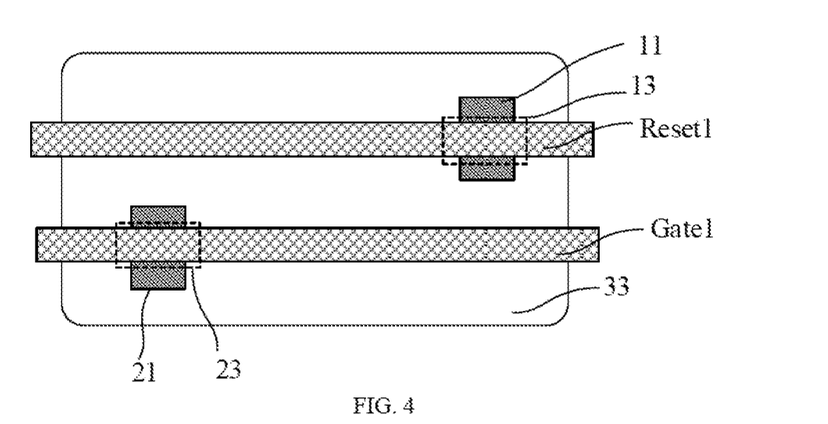
FIG. 4 shows a schematic diagram of a projection relationship of grid electrodes of a first transistor, a second transistor and a third transistor according to an embodiment of the present disclosure.

As shown in FIG. 4, the orthographic projections of the grid electrode 13 of the first transistor T1 and the grid electrode 23 of the second transistor T2 on the base 10 are within the orthographic projection of the grid electrode 33 of the third transistor T3 on the base 10, so that stability of the first transistor T1 and the second transistor T2 can be improved.

It should be noted that an active layer of the first transistor T1 is indicated by 11 and an active layer of the second transistor T2 is indicated by 21. Furthermore. FIG. 4 shows a corresponding projection relationship when the driving circuit is a pixel driving circuit. At this time, the grid electrode 13 of the first transistor T1 is connected to a first reset signal line Reset1, so the grid electrode 13 of the first transistor T1 is actually a part of the first reset signal line Reset1 where there is an overlapping area with the active layer 11 of the first transistor T1. The grid electrode 23 of the second transistor T2 is connected to a first grid line Gate1, so the grid electrode 23 of the second transistor T2 is actually a part of the first grid line Gate1 where there is an overlapping area with the active layer 21 of the second transistor T2.

Of course, when the driving circuit is a GOA circuit, a grid electrode projection relationship of the first transistor T1, the second transistor T2 and the third transistor T3 is similar to that of FIG. 4, except that the grid electrode 13 of the first transistor T1 is connected to the second reset signal line Reset2 and the grid electrode 23 of the second transistor T2 is connected to a input signal line Input.

It is worth noted that in the driving circuit, in addition to classifying the first transistor T1 and the second transistor T2 into the first transistor group 20, materials of the active layers of other transistors may also be changed into oxide semiconductors, and transistors with materials of active layers being oxide semiconductors may be classified into the first transistor group 20, which is not limited to only classify the first transistor T1 and the second transistor T2 into the first transistor group 20, but other transistors into the second transistor group 30.

In addition, in order to ensure that an area enclosed by orthographic projections of transistors in the first transistor group 20 on the base 10 is overlapped with an area enclosed by orthographic projections of transistors in the second transistor group 30 on the base 10, the transistors in the first transistor group 20 can be in one-to-one correspondence with the transistors in the second transistor group 30, that is, an orthographic projection of one transistor in the first transistor group 20 on the base 10 is overlapped with that of one transistor in the second transistor group 30 on the base 10, while an orthographic projection of another transistor in the first transistor group 20 on the base also is overlapped with that of another transistor in the second transistor group 30 on the base 10. Alternatively, a plurality of transistors in the first transistor group 20 may correspond to one transistor in the second transistor group 30, so that an orthographic projection of the plurality of transistors in the first transistor group 20 on the base 10 is overlapped with an orthographic projection of one transistor in the second transistor group 30 on the base 10.

For example, an orthographic projection of the first transistor T1 in the first transistor group 20 on the base 10 is disposed to be overlapped with an orthographic projection of the third transistor T3 in the second transistor group 30 on the base 10, while an orthographic projection of the second transistor T2 in the first transistor group 20 on the base 10 is overlapped with an orthographic projection of other transistors except the third transistor T3 in the second transistor group 30 on the base 10. Alternatively, the orthographic projections of the first transistor T1 and the second transistor T2 in the first transistor group 20 on the base 10 both are overlapped with the orthographic projection of the third transistor T3 in the second transistor group 30 on the base 10.

In actual products, when the first transistor group 20 includes one first transistor T1 and one second transistor T2, the first transistor T1 and the second transistor T2 may be arranged in a same layer or in different layers.

In some embodiments, as shown in FIG. 1, the first transistor T1 and the second transistor T2 are arranged in the same layer, and both the first transistor T1 and the second transistor T2 are separated from the third transistor T3 by a first buffer layer 41.

At this time, the first transistor T1 includes the first active layer 11, the first gate insulating layer 12, the first grid electrode 13, a first interlayer dielectric layer 14 and a first source-drain electrode which are arranged in a direction perpendicular to the base 10 and away from the base 10 in sequence. The first source-drain electrode includes a first source electrode 151 and a first drain electrode 152, and the first source electrode 151 and the first drain electrode 152 are connected to the first active layer 11 through a via hole penetrating the first interlayer dielectric layer 14 and the first gate insulating layer 12. The first active layer 11 refers to the active layer of the first transistor T1, the first grid electrode 13 refers to the grid electrode of the first transistor T1. One of the first source 151 and the first drain 152 refers to the first electrode of the first transistor T1, and the other of the first source 151 and the first drain 152 refers to the second electrode of the first transistor T1.

The second transistor T2 includes the second active layer 21, the first gate insulating layer 12, the second grid electrode 23, a first interlayer dielectric layer 14 and a second source-drain electrode which are arranged in a direction perpendicular to the base 10 and away from the base 10 in sequence. The second source-drain electrode includes a second source electrode 251 and a second drain electrode 252, and the second source electrode 251 and the second drain electrode 252 are connected to the second active layer 21 through a via hole penetrating the first interlayer dielectric layer 14 and the first gate insulating layer 12. The second active layer 21 refers to the active layer of the second transistor T2, the second grid electrode 23 refers to the grid electrode of the second transistor T2. One of the second source 251 and the second drain 252 refers to the first electrode of the second transistor T2, and the other of the second source 251 and the second drain 252 refers to the second electrode of the second transistor T2.

Further, the first active layer 11 and the second active layer 21 are arranged in a same layer, the first grid electrode 13 and the second grid electrode 23 are arranged in a same layer, and the first source-drain electrode and the second source-drain electrode are also arranged in a same layer.

In addition, the third transistor T3 includes a third active layer 31, a third gate insulating layer 32, a third grid electrode 33, a third interlayer dielectric layer 34, and a third source-drain electrode, which are arranged in the direction perpendicular to the base 10 and away from the base 10 in sequence. The third source-drain electrode includes a third source electrode 351 and a third drain electrode 352, and the third source electrode 351 and the third drain electrode 352 are connected to the third active layer 31 through a via hole penetrating a third interlayer dielectric layer 34 and a third gate insulating layer 32. The third active layer 31 refers to the active layer of the third transistor T3, the third grid electrode 33 refers to the grid electrode of the third transistor T3. One of the third source 351 and the third drain 352 refers to the first electrode of the third transistor T3, and the other of the third source 351 and the third drain 352 refers to the second electrode of the third transistor T3.

At this time, both the first transistor T1 and the second transistor T2 are separated from the third transistor T3 by the first buffer layer 41. Specifically, the first active layer 11 and the second active layer 21 are separated from the third source-drain electrode of the third transistor T3 by the first buffer layer 41.

The first buffer layer 41 may be a single-layer silicon oxide film with a thickness of 1000 Å to 4000 Å. The first buffer layer 41 may also be a silicon nitride film and a silicon oxide film which are stacked, and the silicon oxide film is disposed on a side of the silicon nitride film away from the third transistor T3.

The first active layer 11 and the second active layer 21 are made of oxide semiconductor with a thickness of 300 Å to 1500 Å. The first gate insulating layer 12 can be made of silicon oxide with a thickness of 800 Å to 2000 Å. The first grid electrode 13 and the second grid electrode 23 can be made of Mo, Cu or other alloys, stacked metals, etc., with a thickness of 2000 Å to 6000 Å. The first interlayer dielectric layer 14 may be a single-layer silicon oxide film, or a silicon nitride film and a silicon oxide film which are stacked with a total thickness of 3000 Å to 5000 Å.

In other embodiments, the second transistor T2 is located on a side of the first transistor T1 away from the third transistor T3: a second buffer layer is disposed between the first transistor T1 and the third transistor T3, and a third buffer layer is disposed between the first transistor T1 and the second transistor T2.

At this time, along a direction away from the base 10, the third transistor T3, the first transistor T1 and the second transistor T2 are sequentially arranged, the third transistor T3 and the first transistor T1 are separated by the second buffer layer, and the first transistor T1 and the second transistor T2 are separated by the third buffer layer. The second buffer layer and the third buffer layer are made of a single-layer silicon oxide film, or a silicon nitride film and a silicon oxide film which are stacked with a total thickness of 1000 Å to 4000 Å.

In addition, the first transistor T1 includes the first active layer 11, the first gate insulating layer 12, the first grid electrode 13, the first interlayer dielectric layer 14 and the first source-drain electrode arranged in the direction perpendicular to the base 10 and away from the base 10 in sequence, and the second transistor T2 includes the second active layer 21, the second gate insulating layer, the second grid electrode 23, the second interlayer dielectric layer and the second source-drain electrode arranged in the direction perpendicular to the base 10 and away from the base 10 in sequence. Therefore, the third source-drain electrode of the third transistor T3 is separated from the first active layer 11 of the first transistor T1 by the second buffer layer, and the first source-drain electrode of the first transistor T1 is separated from the second active layer 21 of the second transistor T2 by the third buffer layer.

In yet other embodiments, the first transistor T1 is located on a side of the second transistor T2 away from the third transistor T3: a fourth buffer layer is disposed between the second transistor T2 and the third transistor T3, and a fifth buffer layer is disposed between the second transistor T2 and the first transistor T1.

At this time, along the direction away from the base 10, the third transistor T3, the second transistor T2 and the first transistor T1 are sequentially arranged, the third transistor T3 and the second transistor T2 are separated by the fourth buffer layer, and the second transistor T2 and the first transistor T1 are separated by the fifth buffer layer. The fourth buffer layer and the fifth buffer layer are made of a single-layer silicon oxide film, or a silicon nitride film and a silicon oxide film which are stacked with a total thickness of 1000 Å to 4000 Å.

In addition, the first transistor T1 includes the first active layer 11, the first gate insulating layer 12, the first grid electrode 13, the first interlayer dielectric layer 14 and the first source-drain electrode arranged in the direction perpendicular to the base 10 and away from the base 10 in sequence, and the second transistor T2 includes the second active layer 21, the second gate insulating layer, the second grid electrode 23, the second interlayer dielectric layer and the second source-drain electrode arranged in the direction perpendicular to the base 10 and away from the base 10 in sequence. Therefore, the third source-drain electrode of the third transistor T3 is separated from the second active layer 21 of the second transistor T2 by the fourth buffer layer, and the second source-drain electrode of the second transistor T2 is separated from the first active layer 11 of the first transistor T1 by the fifth buffer layer.

In addition, a sixth buffer layer 42 is disposed between the base 10 and the second transistor group 30, and the sixth buffer layer 42 is also made of a single-layer silicon oxide film, or a silicon nitride film and a silicon oxide film which are stacked.

As shown in FIG. 1, a flat layer 43 is disposed between the first transistor group 20 and the second transistor group 30, and the flat layer 43 covers transistors in the second transistor group 30.

The flat layer 43 is made of Siloxane organic (SOG), with a thickness of 0.5 μm to 2 μm. For example, the thickness of the flat layer 43 may be 0.5 μm, 1 μm, 1.5 μm or 2 μm, etc.

After the transistors in the second transistor group 30 are produced on the base 10, the flat layer 43 covering the transistors in the second transistor group 30 is first formed. By using organic siloxane as a material of the flat layer 43, a structure before producing the first transistor group 20 is planarized, with a better planarization effect over that of common organic materials.

Due to influence of crystallization of active layer materials of the transistors in the second transistor group 30 and influence of patterning of source-drain electrodes of the transistors in the second transistor group 30 when the transistors in the second transistor group 30 are produced, an uneven surface of the produced second transistor group 30 is caused. If the first transistor group 20 is produced directly on the uneven second transistor group 30, a defect state of the transistors in the first transistor group 20 may be increased due to an uneven interface. Therefore, in the embodiment of the present disclosure, organic siloxane is used as the material of the flat layer 43, so that the structure before the first transistor group 20 is produced is planarized. Then, when the first transistor group 20 is subsequently produced on the flat layer 43, a problem can be avoided that the defect state of the transistors in the first transistor group 20 increase due to the uneven interface.

In addition, when the transistors in the first transistor group 20 are produced on the flat layer 43, after the active layer made of oxide semiconductor is formed, the oxide semiconductor needs to be annealed to reduce the defect state of the oxide semiconductor, with a annealing temperature of up to 350° C. If a conventional organic material, such as resin, is used as the material of the flat layer 43, it cannot withstand a high temperature above 350° C. which may cause problems in the flat layer 43. However, in the embodiment of the present disclosure, organic siloxane is used as the material of the flat layer 43. Since organic siloxane may be transformed to be a material similar to silica after being cured which can withstand the high temperature above 350° C., the flat layer 43 made of organic siloxane may not be damaged by the temperature of annealing the oxide semiconductor during manufacturing the active layers of the transistors in the first transistor group 20. That is, using organic siloxane as the material of the flat layer 43, a normal high-temperature annealing process of the active layers of the transistors in the first transistor group 20 can be ensured, thus ensuring the stability of the performance of the transistors in the first transistor group 20.

It should be noted that after the transistors in the second transistor group 30 are produced on the base 10, the flat layer 43 covering the transistors in the second transistor group 30 is firstly formed, and then, a buffer layer, which may be the first buffer layer 41, the second buffer layer or the fourth buffer layer, needs to be formed on a side of the flat layer 43 away from the base 10 to separate the second transistor group 30 from the first transistor group 20.

In addition, if the driving circuit is a pixel driving circuit arranged in the active area of the display substrate and configured to drive the luminescent device to emit light, after the first transistor group 20 is formed on the side of the second transistor group 30 away from the base 10, a planarization film is required to be coated on a surface of the first transistor group 20 away from the base 10. The planarization film may be made of resin with a thickness of 1 μm to 3 μm, and then exposure and development processes are adopted so as to form a via hole penetrating the planarization film, and then a patterned anode is formed on the planarization film, and the anode is connected to a corresponding electrode in the lower second transistor group 30 through a via hole penetrating the planarization film and other film layers, so as to obtain a final display substrate.

In an alternative embodiment, the driving circuit is a pixel driving circuit arranged in the active area of the display substrate and configured for driving the luminescent device to emit light. As shown in FIG. 3, the first transistor T1 is a first reset transistor, the second transistor T2 is a compensation transistor, and the third transistor T3 is a driving transistor. A grid electrode of the first reset transistor is connected to the first reset signal line Reset1, a first electrode of the first reset transistor is connected to an initialization signal line Vinit, and a second electrode of the first reset transistor is connected to the first end of the storage capacitor Cst. A grid electrode of the compensation transistor is connected to the first grid line Gate1, a first electrode of the compensation transistor is connected to a second electrode of the driving transistor, and a second electrode of the compensation transistor is connected to the first end of the storage capacitor Cst. A grid electrode of the driving transistor is connected to the first end of the storage capacitor Cst.

In actual products, the first reset transistor is configured to be conducted under the control of a first reset signal input by the first reset signal line Reset1, and an initialization signal provided by the initialization signal line Vinit is transmitted to the first end of the storage capacitor Cst and the grid electrode of the driving transistor to reset the storage capacitor Cst and the grid electrode of the driving transistor. The compensation transistor refers to a transistor that compensates a threshold voltage of the driving transistor, and the driving transistor refers to a transistor that drives the luminescent device to emit light.

Because the driving transistor needs to drive the luminescent device to emit light, the driving transistor needs to have a high carrier mobility. By using polysilicon as an active layer material of the driving transistor, the driving transistor has the high carrier mobility. Thus, the driving transistor is classified into the second transistor group 30, while the first reset transistor and the compensation transistor need to have a low leakage current so as to avoid current leaking from the storage capacitor Cst. Therefore, the oxide semiconductor is adopted as active layer materials of the first reset transistor and the compensation transistor so that the first reset transistor and the compensation transistor have low leakage currents, and the first reset transistor and the compensation transistor are classified into the first transistor group 20.

In addition, the second transistor group further includes a data writing transistor T4, a first luminescent control transistor T5, a second luminescent control transistor T6 and a second reset transistor T7. A grid electrode of the data writing transistor T4 is connected to a second grid line Gate2, a first electrode of the data writing transistor T4 is connected to a data line Data. and a second electrode of the data writing transistor T4 is connected to a first electrode of the driving transistor. A grid electrode of the first luminescent control transistor T5 is connected to a luminescent control signal line EM, a first electrode of the first luminescent control transistor T5 is connected to a first power signal line VDD, and a second electrode of the first luminescent control transistor T5 is connected to the first electrode of the driving transistor. A grid electrode of the second luminescent control transistor T6 is connected to the luminescent control signal line EM, a first electrode of the second luminescent control transistor T6 is connected to a second electrode of the driving transistor, and a second electrode of the second luminescent control transistor T6 is connected to a first electrode of a luminescent device EL. A grid electrode of the second reset transistor T7 is connected to a second grid line Gate2, a first electrode of the second reset transistor T7 is connected to the initialization signal line Vinit, and a second electrode of the second reset transistor T7 is connected to the first electrode of the luminescent device EL. A second end of the storage capacitor Cst is connected to a first power signal line VDD. A second electrode of the luminescent device EL is connected to a third power signal line VSS.

Optionally, the driving transistor, the data writing transistor T4, the first luminescent control transistor T5, the second luminescent control transistor T6 and the second reset transistor T7 are all arranged in a same layer.

That is, for the driving transistor, the data writing transistor T4, the first luminescent control transistor T5, the second luminescent control transistor T6 and the second reset transistor T7, active layers of the transistors in the second transistor group 30 are arranged in the same layer, grid electrodes of the transistors in the second transistor group 30 are arranged in a same layer, and the source-drain electrodes of the transistors in the second transistor group 30 are also arranged in a same layer.

At this time, the first transistor group 20 in the pixel driving circuit only includes the first reset transistor and the compensation transistor, while the second transistor group 30 includes other transistors remaining in the driving circuit, that is, the second transistor group 30 includes the driving transistor, the data writing transistor T4, the first luminescent control transistor T5, the second luminescent control transistor T6 and the second reset transistor T7.

The first reset transistor and the compensation transistor are all N-type transistors, while the driving transistor, the data writing transistor T4, the first luminescent control transistor T5, the second luminescent control transistor T6 and the second reset transistor T7 are all P-type transistors. In addition, the first grid line Gate1 connected to the compensation transistor and the second grid line Gate2 connected to the data writing transistor T4 are not a same grid line.

Figure 5:
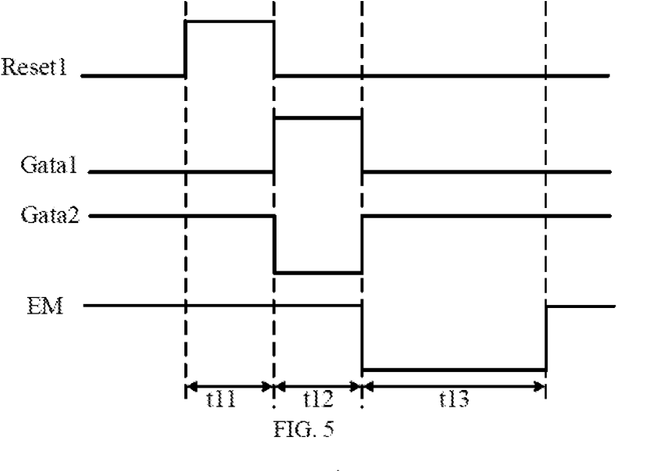
FIG. 5 shows an operation timing diagram corresponding to the pixel driving circuit shown in FIG. 2.

As shown in FIG. 5, in a reset stage t11, the first reset signal input by the first reset signal line Reset1 is a high level signal, so that the first reset transistor is turned on, and the initialization signal input by the initialization signal line Vinit resets the storage capacitor Cst and the grid electrode of the driving transistor. At this time, since a first grid electrode signal input by the first grid line Gate1 is a low level signal, and a second grid electrode signal input by the second grid line Gate2 and a luminescent control signal input by the luminescent control signal EM are both high level signals, the compensation transistor, the data writing transistor T4, the first luminescent control transistor T5, the second luminescent control transistor T6 and the second reset transistor T7 are all turned off.

In a data writing stage t12, the first grid electrode signal input by the first grid line Gate1 is a high level signal, and the second grid electrode signal input by the second grid line Gate2 is a low level signal, so that the compensation transistor and the data writing transistor T4 are turned on. The data signal input by the data line Data charges the storage capacitor Cst through the data writing transistor T4, the driving transistor and the compensation transistor, and a grid electrode voltage of the driving transistor is Vdata+Vth, in which Vth refers to a threshold voltage of the driving transistor and Vdata refers to a voltage of the data signal. At this time, since the first reset signal input by the first reset signal line Reset1 is a low level signal and the luminescent control signal input by the luminescent control signal EM is a high level signal, the first reset transistor T1, the first luminescent control transistor T5 and the second luminescent control transistor T6 are all turned off. Accordingly, the second reset transistor T7 is also turned on, and the second reset transistor T7 resets the first electrode of the luminescent device EL through the initialization signal input by the initialization signal line Vinit.

In a light-emitting stage t13, the luminescent control signal input by the luminescent control signal line EM is a low level signal, so that the first luminescent control transistor T5 and the second luminescent control transistor T6 are turned on, and then a driving current is supplied to the first electrode of the luminescent device EL through the first luminescent control transistor T5, the driving transistor and the second luminescent control transistor T6 to drive the luminescent device EL to emit light, and a magnitude of the driving current is related to a voltage Vdd of the high level voltage signal provided by the first power signal line VDD and a voltage Vdata of the data signal. At this time, since the first reset signal input by the first reset signal line Reset1 and the first grid electrode signal input by the first grid line Gate1 are low level signals, and the second grid electrode signal input by the second grid line Gate2 is a high level signal, the first reset transistor, the compensation transistor, the data writing transistor T4 and the second reset transistor T7 are all turned off.

In another alternative embodiment, the driving circuit is a GOA circuit arranged in the non-active area of the display substrate. As shown in FIG. 3, the first transistor T1 is the third reset transistor, the second transistor T2 is the input transistor, and the third transistor T3 is the output transistor. A grid electrode of the third reset transistor is connected to the second reset signal line Reset2, a first electrode of the third reset transistor is connected to a second power signal line VGL, and a second electrode of the third reset transistor is connected to the first end of the storage capacitor Cst. A grid electrode and a first electrode of the input transistor are both connected to the input signal line Input, and a second electrode of the input transistor is connected to the first end of the storage capacitor Cst. A grid electrode of the output transistor is also connected to the first end of the storage capacitor Cst, a first electrode of the output transistor is connected to a clock signal line CLK, a second electrode of the output transistor is connected to an output signal line Output, and the second end of the storage capacitor Cst is also connected to the output signal line Output.

In practical products, the third reset transistor is configured to reset the storage capacitor Cst, the input transistor is configured to charge the storage capacitor Cst, and the output transistor is configured to output a corresponding signal to the output signal line Output under action of the storage capacitor Cst. The output signal line Output is actually connected to the signal line disposed in the active area and configured to provide a corresponding signal to the signal line in the active area. For example, in an LCD display apparatus, the output signal line Output is connected to a row of grid lines, and is configured to provide grid electrode signals to the grid lines to control on and off of thin film transistors connected to the row of grid lines.

In addition, the second transistor group further includes a fourth reset transistor T8. A grid electrode of the fourth reset transistor T8 is connected to the second reset signal line Reset2, a first electrode of the fourth reset transistor T8 is connected to the second power signal line VGL, and a second electrode of the fourth reset transistor T8 is connected to the output signal line Output. The fourth reset transistor T8 is configured to reset the output signal line Output.

Optionally, the output transistor and the fourth reset transistor T8 are arranged in a same layer. That is, active layers of the output transistor and the fourth reset transistor T8 are arranged in a same layer, grid electrodes of the output transistor and the fourth reset transistor T8 are arranged in a same layer, and source-drain electrodes of the output transistor and the fourth reset transistor T8 are also arranged in a same layer.

At this time, the first transistor group 20 in the GOA circuit includes only the third reset transistor and the input transistor, while the second transistor group 30 includes the output transistor and the fourth reset transistor T8.

The third reset transistor, the input transistor, the output transistor and the fourth reset transistor T8 are all N-type transistors.

Figure 6:
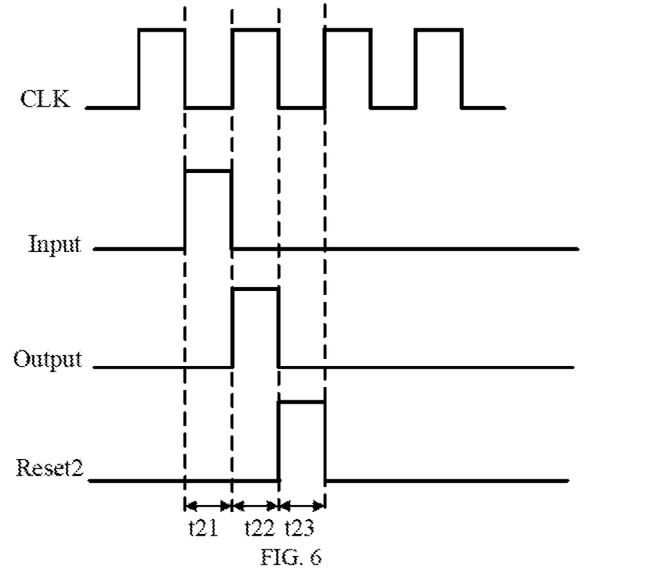
FIG. 6 shows an operation timing diagram corresponding to the GOA circuit shown in FIG. 3.

As shown in FIG. 6, in a first stage t21, a high level signal is input by the input signal line Input to turn on the input transistor so as to charge the storage capacitor Cst. At this time, the output transistor is also turned on, but since a clock signal input by the clock signal line CLK is a low level signal, a low level signal is output by the output transistor to the output signal line Output. In addition, because the second reset signal input by the second reset signal line Reset2 is a low level signal, the third reset transistor and the fourth reset transistor T8 are turned off.

In a second stage t22, due to bootstraping effect of the storage capacitor Cst, a grid electrode voltage of the output transistor is further increased and the output transistor is turned on: and the clock signal input by the clock signal line CLK is a high level signal, so that a high level signal is output by the output transistor to the output signal line Output. At this time, low level signals are input to the input signal line Input and the second reset signal line Reset2, so that the third reset transistor, the input transistor and the fourth reset transistor T8 are all turned off.

In a third stage t23, the second reset signal input by the second reset signal line Reset2 is a high level signal, so that the third reset transistor and the fourth reset transistor T8 are turned on, and the third reset transistor pulls down a voltage at the first end of the storage capacitor Cst, and the fourth reset transistor T8 pulls down a voltage of the output signal line Output, so as to reset the storage capacitor Cst and the output signal line Output.

It should be noted that the GOA circuit is not limited to the third reset transistor, the input transistor, the output transistor and the fourth reset transistor T8 described above, but may further include transistors for controlling potential of a pull-up node and/or a pull-down node. According to actual needs, the transistors with oxide semiconductor as their active layer materials are classified into the first transistor group 20, while the transistors with polysilicon as their active layer materials are classified into the second transistor group 30, and the first transistor group 20 is disposed on a side of the second transistor group 30 away from the base 10.

In the embodiment of the present disclosure, the first transistor group with oxide semiconductor as the active layer material is disposed on the side of the second transistor group with polysilicon as the active layer material away from the base, and the area enclosed by the orthographic projections of the transistors in the first transistor group on the base is overlapped with the area enclosed by the orthographic projections of the transistors in the second transistor group on the base. Stable performance of the transistors included can be ensured in a manufacturing process of the first transistor group and the second transistor group located in different layers, and at the same time, the area occupied by the driving circuit can be reduced so as to decrease the frame width of the display apparatus or improve the resolution of the display apparatus.

Figure 7:
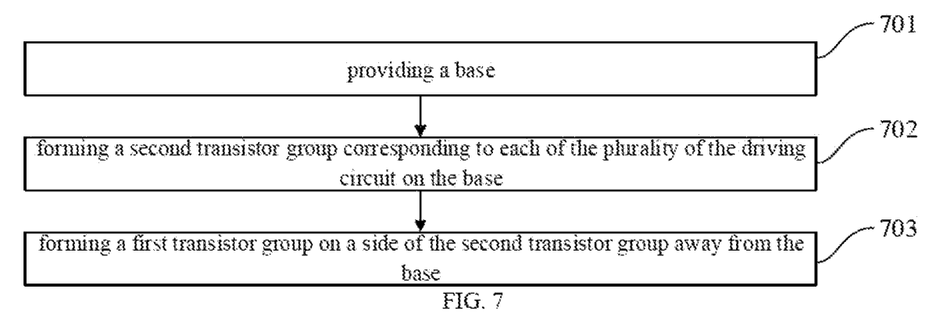
FIG. 7 shows a flow chart of a manufacturing method of a display substrate according to an embodiment of the present disclosure.

Referring to FIG. 7, a flow chart of a manufacturing method of a display substrate according to an embodiment of the present disclosure is shown, which specifically includes following steps S701 to S703.

In step 701, a base is provided.

In the embodiment of the present disclosure, firstly, a base 10, which may be a glass base or a PI base, is manufactured.

In step 702, a second transistor group corresponding to each driving circuit is formed on the base.

In the embodiment of the present disclosure, transistors in the second transistor group 30 corresponding to each driving circuit are formed on the base 10.

The second transistor group 30 includes at least one transistor, and active layers of the transistors in the second transistor group 30 may be made of polysilicon.

In step 703, a first transistor group is formed on a side of the second transistor group away from the base.

In the embodiment of the present disclosure, after the second transistor group 30 corresponding to each driving circuit is manufactured, transistors in the first transistor group 20 are formed on a side of the second transistor group 30 away from the base 10.

The first transistor group 20 includes at least one transistor, and active layers of the transistors in the first transistor group 20 can be made of oxide semiconductor. In addition, an area enclosed by orthographic projections of the transistors in the first transistor group 20 on the base 10 is overlapped with an area enclosed by orthographic projections of the transistors in the second transistor group 30 on the base 10, so as to improve resolution of the display apparatus or reduce a frame width.

Optionally, after step 702, the method further includes: forming a flat layer covering the transistors in the second transistor group.

In the embodiment of the present disclosure, after the second transistor group 30 corresponding to each driving circuit is manufactured, firstly, a flat layer 43 covering the transistors in the second transistor group 30 is formed, and the flat layer 43 is made of organic siloxane. Specifically, organic siloxane is coated on a side surface of the second transistor group 30 away from the base 10 by a coating process, which is then cured to obtain the flat layer 43.

In the embodiment of the present disclosure, the first transistor group with oxide semiconductor as the active layer material is disposed on the side of the second transistor group with polysilicon as the active layer material away from the base, and the area enclosed by the orthographic projections of the transistors in the first transistor group on the base is overlapped with the area enclosed by the orthographic projections of the transistors in the second transistor group on the base. Stable performance of the transistors included can be ensured in a manufacturing process of the first transistor group and the second transistor group located in different layers, and at the same time, the area occupied by the driving circuit can be reduced so as to decrease the frame width of the display apparatus or improve the resolution of the display apparatus.

A display apparatus comprising the display substrate described above is further disposed in an embodiment of the disclosure.

In actual products, the display substrate can be applied to a LCD display apparatus, an OLED display apparatus, a Mini LED display apparatus, a quantum dot LED display apparatus and other products to reduce the frame width of the display apparatus or improve the resolution of the display apparatus.

In specific implementation, the display apparatus according to embodiments of the present disclosure can be any product or component with display function, such as a mobile phone, a tablet computer, a television, a display, a notebook computer, a digital photo frame, a navigator or the like.

In addition, for a specific structure of the display substrate in the display apparatus, description of the display substrate described above can be referred, with similar effect to that achieved by the display substrate described above, which will not be repeatedly described herein so as to avoid repetition.

Reference to "one embodiment", "an embodiment" or "one or more embodiments" herein means that a specific feature, structure or characteristic described in connection with embodiments is included in at least one embodiment of the present disclosure. In addition, it is noted that an example of a word "in one embodiment" here do not necessarily refer to a same embodiment.

In the specification provided here, numerous specific details are set forth. However, it can be understood that the embodiments of the present disclosure can be practiced without these specific details. In some instances, well-known methods, structures and techniques have not been shown in detail in order not to obscure understanding of this specification.

In the claims, any reference signs between parentheses shall not be construed as limitations on the claims. A word "comprising" does not exclude presence of elements or steps not listed in a claim. A word "a" or "an" preceding an element does not exclude presence of a plurality of such elements. The present disclosure can be realized by means of hardware including several different elements and by means of a suitably programmed computer. In a unit claim enumerating several devices, several of these devices can be embodied by a same item of hardware. Use of words "first", "second", "third", etc. does not indicate any order. These words can be interpreted as names.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to some technical features thereof. These modifications or substitutions do not make essence of corresponding technical schemes depart from the spirit and scope of the technical schemes of the embodiments of this disclosure.

The invention claimed is:

1. A display substrate, comprising:
a base; and
a plurality of driving circuits disposed on the base, each of the plurality of driving circuits comprising:
a first transistor group; and
a second transistor group, wherein the first transistor group is located at a side of the second transistor group away from the base;
wherein the first transistor group and the second transistor group each comprises at least one transistor, active layers of transistors in the first transistor group are made of oxide semiconductor, and active layers of transistors in the second transistor group are made of polysilicon; and
an area enclosed by orthographic projections of the transistors in the first transistor group on the base is overlapped with an area enclosed by orthographic projections of the transistors in the second transistor group on the base;
the first transistor group comprises one first transistor and one second transistor, the second transistor group comprises one third transistor, and the third transistor is any one of the transistors in the driving circuit except the first transistor and the second transistor; and
the driving circuit further comprises a storage capacitor, wherein a second electrode of the first transistor and a second electrode of the second transistor are connected to a first end of the storage capacitor.

2. The display substrate according to claim 1, wherein the driving circuit is a pixel driving circuit arranged in an active area of the display substrate and configured for driving a luminescent device to emit light;
the first transistor is a first reset transistor, the second transistor is a compensation transistor, and the third transistor is a driving transistor;
wherein a grid electrode of the first reset transistor is connected to a first reset signal line, a first electrode of the first reset transistor is connected to an initialization signal line, and a second electrode of the first reset transistor is connected to the first end of the storage capacitor;
a grid electrode of the compensation transistor is connected to a first grid line, a first electrode of the compensation transistor is connected to a second electrode of the driving transistor, and a second electrode of the compensation transistor is connected to the first end of the storage capacitor; and
a grid electrode of the driving transistor is connected to the first end of the storage capacitor.

3. The display substrate according to claim 2, wherein the second transistor group further comprises a data writing transistor, a first luminescent control transistor, a second luminescent control transistor and a second reset transistor;
wherein a grid electrode of the data writing transistor is connected to a second grid line, a first electrode of the data writing transistor is connected to a data line, and a second electrode of the data writing transistor is connected to a first electrode of the driving transistor;
a grid electrode of the first luminescent control transistor is connected to a luminescent control signal line, a first electrode of the first luminescent control transistor is connected to a first power signal line, and a second electrode of the first luminescent control transistor is connected to the first electrode of the driving transistor;
a grid electrode of the second luminescent control transistor is connected to the luminescent control signal line, a first electrode of the second luminescent control transistor is connected to the second electrode of the driving transistor, and a second electrode of the second luminescent control transistor is connected to a first electrode of the luminescent device;

a grid electrode of the second reset transistor is connected to the second grid line, a first electrode of the second reset transistor is connected to the initialization signal line, and a second electrode of the second reset transistor is connected to the first electrode of the luminescent device; and a second end of the storage capacitor is connected to the first power signal line.

4. The display substrate according to claim 3, wherein the driving transistor, the data writing transistor, the first luminescent control transistor, the second luminescent control transistor and the second reset transistor are all arranged in a same layer.

5. The display substrate according to claim 1, wherein the driving circuit is a GOA circuit disposed in a non-active area of the display substrate;

a first transistor is a third reset transistor, the second transistor is an input transistor, and the third transistor is an output transistor;

wherein a grid electrode of the third reset transistor is connected to a second reset signal line, a first electrode of the third reset transistor is connected to a second power signal line, and a second electrode of the third reset transistor is connected to the first end of the storage capacitor;

a grid electrode and a first electrode of the input transistor are connected to an input signal line, and a second electrode of the input transistor is connected to the first end of the storage capacitor;

a grid electrode of the output transistor is further connected to the first end of the storage capacitor, a first electrode of the output transistor is connected to a clock signal line, and a second electrode of the output transistor is connected to an output signal line, and a second end of the storage capacitor is further connected to the output signal line.

6. The display substrate according to claim 5, wherein the second transistor group further comprises a fourth reset transistor; and a grid electrode of the fourth reset transistor is connected to the second reset signal line, a first electrode of the fourth reset transistor is connected to the second power signal line, and a second electrode of the fourth reset transistor is connected to the output signal line.

7. The display substrate according to claim 6, wherein the output transistor and the fourth reset transistor are arranged in a same layer.

8. The display substrate according to claim 1, wherein a flat layer is disposed between the first transistor group and the second transistor group, and the flat layer covers the transistors in the second transistor group.

9. The display substrate according to claim 8, wherein the flat layer is made of organic siloxane, and a thickness of the flat layer is 0.5 µm to 2 µm.

10. A display apparatus, comprising the display substrate according to claim 1.

11. The display apparatus according to claim 10, wherein the area enclosed by the orthographic projections of the transistors in the first transistor group on the base is located within the area enclosed by the orthographic projections of the transistors in the second transistor group on the base.

12. The display substrate according to claim 1, wherein the area enclosed by the orthographic projections of the transistors in the first transistor group on the base is located within the area enclosed by the orthographic projections of the transistors in the second transistor group on the base.

13. The display substrate according to claim 1, wherein a grid electrode of the third transistor is further connected to the first end of the storage capacitor;

an orthographic projection of a grid electrode of the first transistor and/or a grid electrode of the second transistor on the base is located in an orthographic projection of a grid electrode of the third transistor on the base.

14. The display substrate according to claim 1, wherein the first transistor and the second transistor are arranged in a same layer, and the first transistor and the second transistor are separated from the third transistor by a first buffer layer.

15. The display substrate according to claim 1, wherein the second transistor is located on a side of the first transistor away from the third transistor; and a second buffer layer is disposed between the first transistor and the third transistor, and a third buffer layer is disposed between the first transistor and the second transistor.

16. The display substrate according to claim 1, wherein the first transistor is located on a side of the second transistor away from the third transistor; and a fourth buffer layer is disposed between the second transistor and the third transistor, and a fifth buffer layer is disposed between the second transistor and the first transistor.

17. A method for manufacturing a display substrate, comprising:

providing a base;

forming a second transistor group corresponding to each of a plurality of driving circuits on the base; and forming a first transistor group on a side of the second transistor group away from the base;

wherein the first transistor group and the second transistor group each comprises at least one transistor, active layers of transistors in the first transistor group are made of oxide semiconductor, and active layers of transistors in the second transistor group are made of polysilicon; and an area enclosed by orthographic projections of the transistors in the first transistor group on the base is overlapped with an area enclosed by orthographic projections of the transistors in the second transistor group on the base;

the first transistor group comprises one first transistor and one second transistor, the second transistor group comprises one third transistor, and the third transistor is any one of the transistors in the driving circuit except the first transistor and the second transistor; and the driving circuit further comprises a storage capacitor, wherein a second electrode of the first transistor and a second electrode of the second transistor are connected to a first end of the storage capacitor.

18. The method according to claim 17, after the step of forming the second transistor group corresponding to each driving circuit on the base, the method further comprises:

forming a flat layer covering the transistors in the second transistor group.

\* \* \* \* \*